(12) United States Patent
Tamura et al.

(10) Patent No.: US 9,670,382 B2
(45) Date of Patent: Jun. 6, 2017

(54) BASE FILM AND PRESSURE-SENSITIVE ADHESIVE SHEET PROVIDED THEREWITH

(75) Inventors: Kazuyuki Tamura, Tokyo (JP); Takashi Akutsu, Tokyo (JP); Yuki Eto, Tokyo (JP); Tomohide Hukuzaki, Osaka (JP)

(73) Assignees: LINTEC Corporation, Tokyo (JP); Arakawa Chemical Industries, LTD., Osaka (JP)

( * ) Notice: Subject to any disclaimer, the term of this patent is extended or adjusted under 35 U.S.C. 154(b) by 61 days.

(21) Appl. No.: 14/005,577

(22) PCT Filed: Mar. 22, 2012

(86) PCT No.: PCT/JP2012/057305
§ 371 (c)(1),
(2), (4) Date: Nov. 19, 2013

(87) PCT Pub. No.: WO2012/128312
PCT Pub. Date: Sep. 27, 2012

(65) Prior Publication Data
US 2014/0065414 A1 Mar. 6, 2014

(30) Foreign Application Priority Data
Mar. 22, 2011 (JP) ................. 2011-062947

(51) Int. Cl.
| | | |
|---|---|---|
| C09J 7/02 | (2006.01) | |
| C09J 175/08 | (2006.01) | |
| C09J 175/16 | (2006.01) | |
| H01L 21/683 | (2006.01) | |
| C08G 18/48 | (2006.01) | |
| C08G 18/67 | (2006.01) | |
| C08G 18/75 | (2006.01) | |
| C08G 18/80 | (2006.01) | |
| B32B 27/36 | (2006.01) | |

(52) U.S. Cl.
CPC ............ *C09J 7/0296* (2013.01); *B32B 27/36* (2013.01); *C08G 18/4825* (2013.01); *C08G 18/672* (2013.01); *C08G 18/755* (2013.01); *C08G 18/8029* (2013.01); *C09J 7/0282* (2013.01); *C09J 175/16* (2013.01); *H01L 21/6836* (2013.01); *B32B 2255/10* (2013.01); *B32B 2255/26* (2013.01); *B32B 2310/0831* (2013.01); *B32B 2405/00* (2013.01); *C08G 2170/40* (2013.01); *C09J 2203/326* (2013.01); *C09J 2475/006* (2013.01); *H01L 2221/6834* (2013.01); *H01L 2221/68327* (2013.01); *Y10T 428/2809* (2015.01); *Y10T 428/31551* (2015.04)

(58) Field of Classification Search
CPC .. C08G 18/672; C08G 18/48; C08G 18/4825; C08G 18/755; C08G 18/8029; C08G 2170/40; C09J 175/16; C09J 2203/326; C09J 2475/006; C09J 7/0282; C09J 7/0296; B32B 225/10; B32B 225/26; B32B 2310/0831; B32B 2405/00; B32B 27/36; H01L 21/6836; H01L 2221/68327; H01L 2221/6834; Y10T 428/2809; Y10T 428/31551; Y10T 428/31565
USPC .......... 428/345, 355 R, 355 N, 423.1, 423.7; 528/44, 66; 526/931
See application file for complete search history.

(56) References Cited

U.S. PATENT DOCUMENTS

| | | |
|---|---|---|
| 6,793,672 B2 | 9/2004 | Khosravi et al. |
| 2005/0269717 A1 | 12/2005 | Ohashi et al. |
| 2006/0188725 A1* | 8/2006 | Yoshida et al. ............ 428/411.1 |
| 2008/0057300 A1* | 3/2008 | Paiva et al. .................. 428/336 |
| 2011/0021705 A1* | 1/2011 | Imoto et al. .................. 525/131 |
| 2011/0030882 A1* | 2/2011 | Mizuno et al. ............... 156/153 |
| 2011/0117364 A1* | 5/2011 | Uesugi et al. ................ 428/354 |
| 2011/0184125 A1* | 7/2011 | Zhao et al. .................... 525/131 |
| 2014/0079947 A1 | 3/2014 | Tamura et al. |

FOREIGN PATENT DOCUMENTS

| | | | |
|---|---|---|---|
| JP | S60196956 A | | 10/1985 |
| JP | S60223139 A | | 11/1985 |
| JP | H0577284 B2 | | 10/1993 |
| JP | H06101455 B2 | | 12/1994 |
| JP | 11-343469 A | | 12/1999 |
| JP | 2002038119 A | * | 2/2002 |
| JP | 2004-288725 A | | 10/2004 |
| JP | 2005-109433 A | | 4/2005 |

(Continued)

OTHER PUBLICATIONS

International application No. PCT/JP2012/057305, Notification of Transmittal of Translation of the International Preliminary Report on Patentability, dated Oct. 3, 2013.
International application No. PCT/JP2012/057305, International Search Report, dated Apr. 24, 2012.
English abstract of JP 2005-123382.
English abstract of JP 2004-288725.
English abstract of JP 2005-109433.
English abstract of WO 2012-128311.

(Continued)

*Primary Examiner* — Thao T Tran
(74) *Attorney, Agent, or Firm* — Cahn & Samuels, LLP

(57) ABSTRACT

The base film of the invention is a base film of a pressure-sensitive adhesive sheet for laminating onto a semiconductor wafer composed of: (A) a layer of a cured product in which a composition including a polyether polyol urethan(meth)acrylate oligomer and an energy ray curable monomer is cured by energy ray irradiation, and (B) a thermoplastic resin layer. The present invention, by using a surface protection sheet, protects a circuit side of a wafer with bumps, prevents collapse of bumps on the circuit side when grinding the back surface, and prevents generation of dimples or cracks on the grinding surface.

3 Claims, No Drawings

(56) References Cited

FOREIGN PATENT DOCUMENTS

| | | | |
|---|---|---|---|
| JP | 2005-123382 A | | 5/2005 |
| JP | 2005-343997 A | | 12/2005 |
| JP | 3739570 B2 | | 1/2006 |
| JP | 2006089627 A | * | 4/2006 |
| JP | 2010-254853 A | | 11/2010 |
| JP | 2011-32410 A | | 2/2011 |
| WO | 2012128311 A1 | | 9/2012 |

OTHER PUBLICATIONS

English abstract of JP 3739570.
English Abstract of JP 2005-343997.
English Abstract of JP 11-343469.
English Abstract of JP 2010-254853.
English Abstract of JP 2011-32410.
English Abstract of JP S60196956 A.
English Abstract of JP S60223139 A.
English Abstract of JP H06101455 B2.
English Abstract of JP H0577284 B2.

* cited by examiner

BASE FILM AND PRESSURE-SENSITIVE ADHESIVE SHEET PROVIDED THEREWITH

This application is a U.S. national stage application of PCT/JP2012/057305 filed on 22 Mar. 2012 which claims priority of Japanese patent document 2011-062947 filed on 22 Mar. 2011, the entireties of which are incorporated herein by reference.

TECHNICAL FIELD

The present invention relates to a base film used as a base of a pressure-sensitive adhesive sheet for a surface protection preferably used to protect a circuit side of a semiconductor wafer to which a circuit is formed on its surface. In particular, the present invention relates to a base film preferably used as a pressure-sensitive adhesive sheet for a surface protection of a semiconductor wafer wherein bumps having a large difference in height are formed on its circuit side. In addition, the present invention relates to a pressure-sensitive adhesive sheet wherein a pressure-sensitive adhesive layer is provided on the base film, and preferably used as a pressure-sensitive adhesive sheet for a surface protection of a semiconductor wafer.

DESCRIPTION OF THE RELATED ART

Along with a rapid process of thinning, down-sizing and multi-functionalizing of an information terminal equipment, thinning and densifying of a semiconductor device mounted thereof are also required. For a thinner device, thinning of a semiconductor integrated semiconductor wafer is demanded. Further, along with the densifying, it is required to further improve a mount technology of a semiconductor chip, to which spherical bumps, used for a junction of the semiconductor chip and the base, are formed on the circuit side of the semiconductor chip. The spherical bumps are made by solder or so and have a diameter of around several hundred μm. Generally, the bumps are preliminarily densely joined to the semiconductor wafer. When grinding the back surface of such wafer with bumps, a pressure difference, due to a difference in height of parts where bumps exist and where bumps do not exist, directly influence the back surface of the wafer, which cause depressions or cracks, referred to as dimples, and finally leads to breakage of the semiconductor wafer.

Therefore when grinding the back surface of the wafer with bumps, a surface protection sheet is laminated on a circuit side, moderating the difference in height of the circuit side. In particular, considering the wafer with bumps having a large difference in height, the pressure-sensitive adhesive layer and the wafer are closely-attached and a pressure difference due to a level difference of the bumps is resolved by a cushioning property of the pressure-sensitive adhesive layer by thickening a thickness of a pressure-sensitive adhesive layer of the surface protection sheet and by increasing a flowability of the pressure-sensitive adhesives. However, thickening a thickness of the pressure-sensitive adhesive layer and increasing its flowability make it easy for the pressure-sensitive adhesives to wraparound base parts of the bumps. Therefore, by a release acting of the surface protection sheet, the pressure-sensitive adhesives attached to the base parts of the bumps may be destructed in the layer, and partly left and attached to the circuit side. This may be caused even when using the surface protection sheet of an energy-ray-curable pressure-sensitive adhesives. If the pressure-sensitive adhesives left and attached to the circuit side is not removed by a solvent cleaning and the like, it will remain as a foreign substance in a device, degrading a reliability of the completed device.

In order to solve such problems, Patent Article 1 (Japanese Laid-open Patent Publication No. 2005-123382) describes a surface protection sheet comprising an opening part, having a smaller diameter than outer diameter of the semiconductor wafer for laminating onto one surface of the base sheet, and to which a pressure-sensitive adhesive layer is not formed, and a part, to which a pressure-sensitive adhesive layer is formed on the outside periphery of the opening, on one surface of a base sheet; and it describes a grinding method using the surface protection sheet. This surface protection sheet has a structure wherein a double-sided pressure-sensitive adhesive sheet, punched in a shape of a ring, is formed on one surface of a base sheet; and the pressure-sensitive adhesives is not provided in an area contacting the bumps. Therefore, it can be used making the pressure-sensitive adhesives not to attach the base part of the bumps.

Further, Patent Article 2 (Japanese Laid-open Patent Publication No. 2004-288725) describes the following: the method of manufacturing a semiconductor device comprises a semiconductor element forming process of forming a plurality of pad electrodes at prescribed positions on the active surface of IC wafer, a bump forming process of forming bumps on the pad electrodes, and a back grinding process of reducing the thickness of the IC wafer to a prescribed value by grinding the nonactive surface of the IC wafer. In the bump forming process, the bumps are formed on the IC wafer except on its peripheral part, and a support member forming process of forming or laminating a support member on the above peripheral part is provided between the bump forming process and the back grinding process. In the back grinding process, the nonactive surface of the IC wafer is subjected to grinding while the peripheral part of the IC wafer is supported by the supporting member.

Further, Patent Article 3 (Japanese Laid-open Patent Publication No. 2005-109433) describes the following for a surface protection sheet: "A protection member for protecting the back surface of a semiconductor wafer, disposing the bumps on its surface, which is a bump protection member for grinding includes: a periphery adhesive part to be adhered to the periphery of a semiconductor wafer on which the bumps are not formed, a bump protection part surrounded by the periphery adhesive part to support and protect the bumps, and a concave formed of the periphery adhesive part and the bump protection part to contain the bumps".

According to the grinding method described in the above article, the periphery part of bumps formed surface of wafer is surrounded by an pressure-sensitive adhesive layer; and the bumps formed surface is covered by an approximately wafer shaped base sheet (a resin film) bonded on this pressure-sensitive adhesive layer, and protects the bumps formed surface.

When the back surface grinding of wafer at this protection state is performed, bumps are pressed to the resin film due to a pressure of a grinder used for the grinding. Therefore, bumps of the circuit side may collapse, and dimples or cracks may be generated on the back surface of wafer during the back surface grinding of the wafer. In particular, such problems are apparent when a hardness of the resin film is too high. While too low, a shape-keeping property becomes insufficient, and there is an increased risk for breakage of the wafer when transporting to the next step subsequent to the grinding.

Further, Patent Article 4 (Japanese Patent No. 3739570) describes the following: a pressure-sensitive adhesive sheet for a surface protection using a base showing a special dynamic viscoelasticity as a pressure-sensitive adhesive sheet for a surface protection used as a wafer with bumps. This pressure-sensitive adhesive sheet for a surface protection was capable for responding to a wafer wherein differences in height of bumps are relatively small. However, when the back surface grinding is performed to a semiconductor wafer, with a roughness having a difference in height of more than 150 μm, to be ultrathin, dimples or cracks may be generated on said back surface of the wafer.

CITATION LIST

Patent Article 1: Japanese Laid-open Patent Publication No. 2005-123382
Patent Article 2: Japanese Laid-open Patent Publication No. 2004-288725
Patent Article 3: Japanese Laid-open Patent Publication No. 2005-109433)
Patent Article 4: Japanese Patent No. 3739570

SUMMARY OF INVENTION

The present invention was made in consideration of the above-described conventional technique. It is therefore an object of the invention is to protect a circuit side of a wafer with bumps using a surface protection sheet, and to prevent collapse of bumps on the circuit side when grinding the back surface, as well as to prevent generation of dimples or cracks on the grinding surface.

The present inventors, as a result of intensive research in order to solve the above problems, have found that a viscoelasticity of a surface protection sheet becomes proper by placing a resin layer formed of a specific resin as a base film of the surface protection sheet, and that bumps may not collapse even when bumps are pressed to the sheet and a difference in height of the wafer surface with bumps can be moderated, which prevents a generation of dimples or cracks on a grinding surface; and this lead to a completion of the invention.

The summary of the present invention aimed at achieving the above object is as follows.

[1] A base film of a pressure-sensitive adhesive sheet for laminating onto a semiconductor wafer composed of;
(A) a layer of a cured product in which a composition including a polyether polyol urethan(meth)acrylate oligomer and an energy ray curable monomer is cured by energy ray irradiation, and
(B) a thermoplastic resin layer.

[2] The base film according to [1], wherein a weight-average molecular weight of the polyether polyol urethan (meth)acrylate oligomer is 40,000 to 100,000.

[3] The base film according to [1] or [2], wherein a molecular weight of a polyether type polyol moiety of the polyether polyol urethan(meth)acrylate oligomer is 1,000 to 10,000.

[4] A pressure-sensitive adhesive sheet comprising a pressure-sensitive adhesive layer (C) on the base film according to any one of [1] to [3].

[5] The pressure-sensitive adhesive sheet according to [4], wherein a compression stress at 23° C. is 0.05 to 1.0 MPa.

The present invention was made in consideration of the above-described conventional technique. According to the present invention, a circuit side of the wafer with bumps is protected using a surface protection sheet; and bumps of the circuit side is prevented to collapse when grinding the back surface, and a generation of dimples or cracks on grinding surface can be prevented.

DETAILED DESCRIPTION OF THE INVENTION

Hereinafter, the present invention including the most favorable embodiment will be described in concrete. A base film according to the present invention is a base film of a pressure-sensitive adhesive sheet for laminating onto a semiconductor wafer composed of (A) a layer of a cured product in which a composition including a polyether polyol urethan (meth)acrylate oligomer and an energy ray curable monomer is cured by an energy ray irradiation (Hereinafter, it may be abbreviated to "an energy ray curable layer") and (B) a thermoplastic resin layer (Hereinafter, it may be abbreviated to "a thermoplastic resin layer").

[(A) An Energy Ray Cured Layer]

(A) An energy ray cured layer is a cured product in which a composition including the polyether polyol urethane (meth)acrylate oligomer and an energy ray curable monomer is cured by an energy ray irradiation.

The polyether polyol urethan(meth)acrylate oligomer is a compound which comprises a unit derived from the polyether polyol and an energy ray-polymerizable (meth) acryloyl group, and further comprises a urethane bond in its molecule. Said polyether polyol urethan(meth)acrylate oligomer is obtained by, for instance, reacting a terminal isocyanate urethane prepolymer, obtained from reacting a polyether type polyol compound and a polyvalent isocyanate compound, with (meth)acrylate having a hydroxy group. Note, in the present specification, (meth)acryl is used as to include both acryl and methacryl.

The polyether type polyol compound is not particularly limited; and it may be a diol of two-functional groups, a triol of three-functional groups, and further, a polyol of four or more-functional groups. However, considering availability, versatility, reactivity and the like, it is particularly preferably to use diol. Therefore, polyether type diol is preferably used.

The polyether type diol is generally shown as HO—(—R—O—)n-H. Here, "R" is a divalent hydrocarbon group, preferably an alkylene group, more preferably a C1-6 alkylene group, and particularly preferably a C3 or C4 alkylene group. Further, of the C1-6 alkylene groups, ethylene, propylene and tetramethylene are preferable, and propylene and tetramethylene are particularly preferable. "n" is a repeat count number of (—R—O—); and it is preferably around 10 to 250, more preferably around 25 to 205, and the most preferably around 40 to 185. When "n" is smaller than 10, a urethane bond concentration of urethan(meth)acrylate oligomer is increased, and a compression stress of an energy ray cured layer (A) is increased. When "n" is larger than 250, it is concerned that the compression stress is difficult to be decreased.

A molecular weight calculated from a hydroxyl value of the diol of a polyether type polyol compound is preferably around 1000 to 10000, more preferably around 2000 to 9000, and the most preferably around 3000 to 8000. When said molecular weight is lower than 1000, the urethane bond concentration of urethan(meth)acrylate oligomer is increased, and the compression stress of an energy ray cured layer (A) is increased. When the molecular weight is too high, the urethane bond concentration becomes low; and it is concerned that the compression stress is difficult to be decreased.

Here, the molecular weight of the polyether type polyol compound is a functional group number of the polyether type polyol×56.11×1000/hydroxyl value [mgKOH/g], and is a value calculated from a hydroxyl value of the polyether type polyol compound.

A terminal isocyanate urethane prepolymer, to which an ether bond part (—(—R—O—)n-) is introduced, is produced by a reaction of the polyether type diol and the polyvalent isocyanate compound. With the use of such polyether type diol, the urethan(meth)acrylate oligomer includes structural units derived from the polyether type diol.

Examples of the polyisocyanates include aliphatic polyisocyanates such as tetramethylene diisocyanate, hexamethylene diisocyanate and trimethylhexamethylene diisocyanate; alicyclic diisocyanates such as isophorone diisocyanate, norbornane diisocyanate, dicyclohexylmethane-4,4'-diisocyanate, dicyclohexylmethane-2,4'-diisocyanate and ω,ω'-diisocyanate dimethylcyclohexane; and aromatic diisocyanates such as 4,4'-diphenylmethane diisocyanate, tolylene diisocyanate, xylylene diisocyanate, tolidine diisocyanate, tetramethylenexylylene diisocyanate and naphthalene-1,5-diisocyanate. Of these, isophorone diisocyanate, hexamethylene diisocyanate and xylylene diisocyanate are preferable because the obtainable urethane (meth)acrylate oligomers maintain low viscosity and show good handling properties.

A terminal isocyanate urethane prepolymer, obtained by reacting such polyether type polyol compound and polyvalent isocyanate compound, is reacted with (meth)acrylate having a hydroxy group; and the polyether polyol urethan (meth)acrylate oligomer is obtained.

The (meth)acrylates having a hydroxyl group are not particularly limited as long as the compounds have a hydroxyl group and a (meth)acryloyl group in one molecule. Known such compounds may be used, with examples including hydroxyalkyl (meth)acrylates such as 2-hydroxyethyl (meth)acrylate, 2-hydroxypropyl (meth)acrylate, 4-hydroxybutyl (meth)acrylate, 4-hydroxycyclohexyl (meth) acrylate, 5-hydroxycyclooctyl (meth)acrylate, 2-hydroxy-3-phenyloxypropyl (meth)acrylate, pentaerythritol tri(meth) acrylate, polyethylene glycol mono(meth)acrylate and polypropylene glycol mono(meth)acrylate; a hydroxy group containing (meth)acrylamide such as N-methylol (meth) acrylamide; and products from the reaction of diglycidyl esters of vinyl alcohol, vinylphenol or bisphenol A, with (meth)acrylic acid.

The terminal isocyanate urethane prepolymer and the (meth)acrylate having a hydroxy group may be reacted together at about 60 to 100° C. for about 1 to 4 hours, optionally in a solvent in the presence of a catalyst as required.

A weight-average molecular weight Mw (a value in terms of polystyrene using a gel permeation chromatography, which is the same hereinafter) of thus obtained polyether polyol urethan(meth)acrylate oligomer is not particularly limited; and generally, the weight-average molecular weight Mw is preferably around 40,000 to 100,000, more preferably around 41,000 to 80,000, and the most preferably 45,000 to 70,000. When the weight average molecular weight Mw is 40,000 or more, the breaking elongation of the energy ray cured layer may be increased; while when 100,000 or less, resin viscosity of the urethan(meth)acrylate oligomer can be lowered, which improves handling ability of a coating liquid for forming film.

The obtained polyether polyol urethan(meth)acrylate oligomer has a photopolymerizable double bond in its molecule; and has a property wherein it is irradiated with energy rays to polymerize and cure, resulting to have a film forming property. Such polyether polyol urethan(meth)acrylate oligomer comprises a polyether type polyol moiety having a relatively long chain length in its molecule; and further, acryloyl group of a polymerization starting point is small in relative to the molecular weight; and thus, an energy ray cured layer (A) including a cured product of the urethan (meth)acrylate oligomer shows a specific viscoelasticity as mentioned below.

The above mentioned polyether polyol urethan(meth) acrylate oligomer can be used alone or in a combination of two or more kinds. It is often difficult to form film only with the above mentioned urethan(meth)acrylate oligomer, and thus, according to the present invention, an energy ray cured layer (A) is obtained by forming a film by mixing the energy ray curable monomer and curing thereof. The energy ray curable monomer has an energy ray-polymerizable double bond in its molecule; and according to the present invention in particular, an acrylic ester based compound having a relatively bulky group is preferably used.

Examples of the energy ray curable monomers include (meth)acrylates of C1-30 alkyl groups such as methyl (meth) acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-pentyl (meth)acrylate, n-hexyl (meth)acrylate, 2-ethylhexyl (meth)acrylate, n-octyl (meth)acrylate, nonyl (meth)acrylate, decyl (meth) acrylate, undecyl (meth)acrylate, dodecyl (meth)acrylate, tridecyl (meth)acrylate, tetradecyl (meth)acrylate, hexadecyl (meth)acrylate, octadecyl (meth)acrylate and eicosyl (meth)acrylate; alicyclic (meth)acrylates such as isobornyl (meth)acrylate, dicyclopentenyl (meth)acrylate, dicyclopentanyl (meth)acrylate, dicyclopentenyl oxy-(meth)acrylate, cyclohexyl (meth)acrylate and adamantane (meth)acrylate; aromatic (meth)acrylates such as phenyl hydroxypropyl acrylate, benzyl acrylate and 2-hydroxy-3-phenoxypropyl acrylate; and heterocyclic (meth)acrylates such as tetrahydrofurfuryl (meth)acrylate and morpholine acrylate; and vinyl compounds such as styrene, hydroxy ethyl vinyl ether, hydroxy butyl vinyl ether, N-vinyl formamide, N-vinyl pyrrolidone and N-vinylcaprolactam. Polyfunctional (meth) acrylates may be used as required.

Among all, considering a compatibility with urethan (meth)acrylate oligomer, alicyclic (meth)acrylates, aromatic (meth)acrylates and heterocyclic (meth)acrylates having a relatively bulky group is preferable.

The energy ray curable monomer is preferably used in an amount of 10 to 500 parts by weight, and more preferably 30 to 300 parts by weight based on 100 parts by weight (in terms of solid) of the urethan(meth)acrylate oligomer.

For the method of film-formation, a flow casting film forming (casting) method may be preferably adopted. In detail, the liquid composition (the liquid diluting the mixture of the above components with solvent as needed) may be cast on a process sheet or the like to form a thin coating, and the coating may be irradiated with energy rays to polymerize and cure the composition to form a film. According to such production process, the stress applied to the resin during the film-formation is small and the occurrence of fish eyes is reduced. Further, the film has high uniformity in thickness, and the thickness accuracy is usually within 2%. UV rays, electron beams or the like are used as the energy rays, in concrete. The dose of the energy rays depends on the kind of the energy rays. In the case of UV rays, UV intensity is preferably around 50 to 300 mW/cm$^2$, the dose of UV rays is preferably around 100 to 1200 mJ/cm$^2$.

When UV is used as an energy ray when forming film, it is capable to react by including a photoinitiator to the composition. Such photopolymerization initiators include photopolymerization initiators such as benzoin compound, acetophenone compound, acyl phosphine oxide compound, titanocene compound, thioxanthone compound, peroxide compound; and photosensitizers such as amine or quinone. And in detail, 1-hydroxy-cyclohexyl-phenyl-ketone, 2-hydroxy-2-methyl-1-phenyl-propan-1-one, benzoin, benzoin methyl ether, benzoin ethyl ether and benzoin isopropyl ether can be exemplified.

The photoinitiator is preferably used in an amount of 0.05 to 15 parts by weight, more preferably 0.1 to 10 parts by weight, and the most preferably 0.3 to 5 parts by weight, based on 100 parts by weight of a total amount of the urethan(meth)acrylate oligomer and the energy ray curable monomer.

The above composition may contain inorganic fillers such as calcium carbonate, silica and mica, metal fillers such as iron and lead. In addition to these components, the energy ray cured layer (A) may contain other additives such as colorants including pigments and dyes.

The above energy ray cured layer (A) and the below mentioned thermoplastic resin layer (B) are laminated to form a base film. The energy ray cured layer (A) may be film-formed on the process sheet, and then laminated on the thermoplastic resin layer (B); while the energy ray cured layer (A) may be directly film-formed on the thermoplastic resin layer (B).

When bumps and the like formed on the wafer surface are pressed, the obtained energy ray cured layer (A) shows specific viscoelasticity, promptly deforms according to the shape of bumps, and moderates pressure due to the difference in height of the bumps; and thus, bumps do not collapse even when the bumps are pressed. Further, residual stress after the deformation is small; and that the wafer is stably maintained and the generation of dimples or cracks are inhibited.

A modulus of elasticity in torsion of the energy ray cured layer (A) is preferably 0.1 to 6 MPa, more preferably 0.3 to 3 MPa, and the most preferably 0.5 to 2 MPa. When said modulus of elasticity in torsion is within the above range, the energy ray cured layer (A) provides a physical property of a pressure-sensitive adhesive sheet which can prevent the generation of collapses or dimples of bumps.

Compression stress of the below mentioned pressure-sensitive adhesive sheet can be adjusted to a preferable range according to the thickness of the energy ray cured layer (A), the use of a specific polyether type polyol compound (molecular weight and the like), the use of a specific polyether polyol urethan(meth)acrylate oligomer (molecular weight and the like), and so on.

[(B) A Thermoplastic Resin Layer]

The thermoplastic resin layer (B) includes polyester resins such as polyethylene terephthalate (PET); polyolefin resins such as polyethylene (PE), polypropylene (PP); thermoplastic resins such as polyimide (PI), polyether ether ketone (PEEK), polyvinyl chloride (PVC), polyvinylidene chloride resin, polyamide resin, polyurethane resin, polystyrene resin, acryl resin, fluorine resin, cellulose resin, polycarbonate resin. These thermoplastic resins can be used as a single layer or as a multi-layered product by laminating thereof.

The thermoplastic resin layer (B) may be formed on one side or on double-sides of the energy ray cured layer (A).

The energy ray cured layer (A) is relatively easily deformed as mentioned above; and thus, it is difficult to maintain its shape. Therefore, when the base film is only formed by the energy ray cured layer (A), the handling ability is not good which may decrease its working efficiency. By laminating a relatively hard thermoplastic resin layer (B) on the energy ray cured layer (A), a base film having a suitable shape-keeping property and an excellent handling ability can be obtained.

Although a thickness of the thermoplastic resin layer (B) is not particularly limited; it is preferably 10 to 1,000 µm, and more preferably 20 to 500 µm.

[A Base Film]

As mentioned, a base film was produced by laminating the energy ray cured layer (A) and the thermoplastic resin layer (B). The energy ray cured layer (A) and the thermoplastic resin layer (B) can be directly laminated, or can be adhered via an adhesive layer.

Manufacturing method of the base film is not particularly limited; and for example, a composition including the polyether polyol urethan(meth)acrylate oligomer and the energy ray curable monomer is cast on a process sheet to form a thin coating, dried the coating when required, and the coating may be irradiated with a small amount of energy rays to partly polymerize and cure the coating to make a semi-cured layer; further, the thermoplastic resin layer (B) is laminated thereto, irradiated with energy rays and cure the semi-cured layer to obtain the energy ray cured layer (A); and the process sheet is removed.

Further, the thermoplastic resin layer (B) is laminated on the energy ray cured layer (A) side of a laminated body, comprising the energy ray cured layer (A) and the thermoplastic resin layer (B); and then a base film to which the thermoplastic resin layer (B) is laminated on both sides of the energy ray cured layer (A).

A pressure-sensitive adhesive sheet according to the present invention is manufactured by forming the pressure-sensitive adhesive layer (C) on one surface of the base film. The base film surface, preferably the energy ray cured layer (A) surface, to which a pressure-sensitive adhesive layer is formed, may be corona treated or may be provided with a primer layer in order to improve a closely-attached property with the pressure-sensitive adhesive layer.

[(C) A Pressure-Sensitive Adhesive Layer]

The pressure-sensitive adhesive layer (C) is not limited to a specific kind as long as it is suitably re-releasable to the wafer, and may be formed of any known pressure-sensitive adhesives. Examples of the pressure-sensitive adhesives are not limited, however, they include rubber-based pressure-sensitive adhesives, acrylic pressure-sensitive adhesives, silicone-based pressure-sensitive adhesives and polyvinyl ether pressure-sensitive adhesives. Further, energy ray curable pressure-sensitive adhesives which become re-releasable by curing with an energy ray, heat-foaming pressure-sensitive adhesives and water-swellable pressure-sensitive adhesives may be used.

Particularly preferred energy ray curable (e.g., UV ray curable, electron beam curable) pressure-sensitive adhesives are UV ray curable pressure-sensitive adhesives. Examples of such energy-ray-curable pressure-sensitive adhesives are described such as in Japanese Laid-Open Patent Publication No. S60-196956 or in Japanese Laid-Open Patent Publication No. S60-223139. Examples of the water-swellable pressure-sensitive adhesives are described such as in Japanese Patent No. H5-77284 or in Japanese Patent No. H6-101455.

Although thickness of the pressure-sensitive adhesives layer (C) is not particularly limited, it is preferably 5 to 200 µm, and more preferably 10 to 120 µm.

Here, the pressure-sensitive adhesive layer (C) may be laminated with a release sheet which protects the pressure-sensitive adhesive layer (C) before the use thereof. The release sheets are not particularly limited, and base for the release sheets that are treated with a releasing agent may be used. The base for the release sheets include films of resins such as polyethylene terephthalate, polybutylene terephthalate, polypropylene and polyethylene, and foamed films of these films, and the papers such as glassine paper, coated paper and laminated paper. The releasing agents include silicone compounds, fluoro compounds and carbamates containing long-chain alkyl groups.

The method to manufacture the pressure-sensitive adhesive layer (C) on the base film surface is as follows. The pressure-sensitive adhesive layer (C) may be applied on a release sheet so as to obtain a predetermined thickness, and may be transferred on the base film surface. Alternatively, the pressure-sensitive adhesive layer (C) may be formed by direct application on the base film.

[A Pressure-Sensitive Adhesive Sheet]

The pressure-sensitive adhesive sheet according to the present invention is manufactured by forming the pressure-sensitive adhesive layer (C) on one surface of the base film. In case when the base film is a two-layer structure, to which the thermoplastic resin layer (B) is laminated on one surface of the energy ray cured layer (A), the pressure-sensitive adhesive layer (C) is preferably formed on the surface of the energy ray cured layer (A). The pressure-sensitive adhesive sheet according to the present invention can be any form such as a tape-like, a label-like, and the like.

Specific viscoelasticity of the pressure-sensitive adhesive sheet can be easily evaluated by a compression stress calculated from a load measured when a test piece with bumps having a predetermined shape is pressed at a predetermined rate. The measurement will be described in detail below. Compression stress of the pressure-sensitive adhesive sheet at 23° C. is preferably 0.05 to 1.0 MPa, more preferably 0.06 to 0.7 Mpa, and the most preferably 0.07 to 0.3 Mpa. When the compression stress is within the above range, a pressure-sensitive adhesive sheet shows the above-mentioned viscoelasticity and collapses of bumps or a generation of dimples can be prevented.

Although a thickness of the energy ray cured layer (A) and the same of the pressure-sensitive adhesive layer (C) in the pressure-sensitive adhesive sheet according to the present invention is not particularly limited, when the pressure-sensitive adhesive sheet is applied to a circuit side of the wafer with bumps, the thickness of the energy ray cured layer (A) and the same of pressure-sensitive adhesive layer (C) can be suitably determined according to a height of bumps on the circuit side. The height of bumps is a height from a flat surface (an area where bumps are not formed) of the circuit side to top of the bumps; and it is determined by an arithmetic mean of heights of a plural number of bumps.

[A Processing Method of the Semiconductor Wafer]

The pressure-sensitive adhesive sheet according to the present invention can be used for processing of the semiconductor wafer as shown below.

(Grinding Method of the Wafer Back Surface)

According to the grinding of the wafer back surface, the pressure-sensitive adhesive sheet is laminated to the circuit side of the semiconductor wafer, to which the circuit is formed on the surface, protecting the circuit side; and by grinding the back surface of the wafer while protecting the circuit, a predetermined thickness of wafer is obtained.

Semiconductor wafer may be a silicon wafer or a compound semiconductor wafer of such as gallium arsenide. Circuit formation on the wafer surface can be performed with various methods including conventionally used processes such as etching process, liftoff process and the like. By a circuit formation process of the semiconductor wafer, a predetermined circuit is formed. Although a thickness of such wafer before grinding is not particularly limited, it is generally around 500 to 1,000 μm. Further, although a surface formation of the semiconductor wafer is not particularly limited, a pressure-sensitive adhesive sheet of the present invention is preferably used particularly for a surface protection of a wafer to which bumps are formed on its surface.

The pressure-sensitive adhesive sheet of the present invention has the above-mentioned energy ray cured layer (A) and the pressure-sensitive adhesive layer (C), and has a viscoelasticity which can sufficiently follow the roughness of the bumps. Therefore, said pressure-sensitive adhesive sheet is embedded to a side of the wafer to which bumps are formed, in order to eliminate the difference of the roughness and to maintain a smoothness of the wafer. Further, it has a high followability to the surface shape of the wafer. Therefore, when a strong shear force is loaded to the wafer when grinding the back surface of wafer, oscillation or positional shift of the wafer can be prevented, and the back surface of wafer can be grinded to have a ultrathin thickness. Further, the base film includes the energy ray cured layer (A), and that bumps do not collapse even when the bumps are pressed to the base film.

The back surface grinding is performed with a conventional method using such as a grinder, a suction table for fixing the wafer, and the like while having the pressure-sensitive adhesive sheet laminated. After the back surface grinding process, a removal treatment of a fractured layer produced by grinding can be performed. Although a thickness of semiconductor wafer after the back surface grinding is not particularly limited, it is preferably around 10 to 400 μm, and more preferably around 25 to 300 μm.

After the back surface grinding process, a pressure-sensitive adhesive sheet is removed from the circuit side. The pressure-sensitive adhesive sheet according to the present invention, during the back surface grinding of the wafer, the wafer is sufficiently held and an invasion of grinding water to a circuit side can be prevented.

(A Wafer Dicing Method)

The pressure-sensitive adhesive sheet according to the present invention can also be used as a dicing sheet. When used as a dicing sheet, the pressure-sensitive adhesive sheet of the present invention is laminated to the wafer, and then the wafer is cut. In particular, it is preferable in case when the pressure-sensitive adhesive sheet of the present invention is laminated to a circuit side of the wafer, and cut the wafer while protecting the circuit side by the pressure-sensitive adhesive sheet. Although the lamination of the dicing sheet is generally performed by a device called mounter, it is not particularly limited.

A cutting mean of the semiconductor wafer is not particularly limited. A method in which the wafer is chipped by a conventional method using a rotating round blade such as a dicer after fixing a periphery part of a dicing tape by a ring frame when cutting the wafer is exemplified. Further, a dicing method using a laser beam can also be used.

(A Pre-Dicing Method)

Further, the pressure-sensitive adhesive sheet according to the present invention is preferably used to make a chip of the wafer with high bumps by what is called a pre-dicing method. In concrete, it is preferably used in the following semiconductor chip manufacturing method. A groove shallower than a thickness of the wafer is formed from a surface of the semiconductor wafer, to which a circuit with bumps is formed on the surface. The above pressure-sensitive adhesive sheet is laminated to the circuit formed face as a surface protection sheet, and then the back surface grinding is performed to the above mentioned semiconductor wafer to make the wafer thin, and finally divided to individual chips.

With the use of the pressure-sensitive adhesive sheet according to the present invention, a high closely-attached property can be obtained between the chip and the pressure-sensitive adhesive layer. Thus, there is no infiltration of the grinding water to the circuit side, and a contamination of the chips is prevented.

Subsequently, pick-up is performed to the chips with a predetermined method. While, chips in an aligned state of the wafer form may be transferred to the other pressure-sensitive adhesive sheet, and then the pick-up of the chips may be performed.

EXAMPLES

The present invention will be described based on examples hereinbelow, however, the scope of the invention is not limited to such examples. In examples and comparative examples below, various physical properties were measured as follows.

(A Modulus of Elasticity in Torsion)

An energy ray cured layer having a diameter of 8 mm and a thickness of 3 mm was prepared, and a modulus of elasticity in torsion was measured using a viscoelasticity measuring device (Name of the device: DYNAMIC ANALYZER RDA II manufactured by Rheometrics Co.) in 1 Hz at 23° C.

(Compression Stress)

A pressure-sensitive adhesive sheet comprising a thermoplastic resin layer, an energy ray cured layer and an acrylic pressure-sensitive adhesive layer was cut to a shape of 15 mm long×15 mm wide. A release sheet was removed from the pressure-sensitive adhesive sheet, and chips with bumps of silicon wafer having 10 mm long×10 mm wide×200 µm thickness (bumps height: 250 µm and bumps pitch: 500 µm) was pressed to an exposed face of the pressure-sensitive adhesive layer so as to uniformly contact the bumps on whole plane of the chip at a rate of 0.6 mm/min. with a universal tensile compression testing machine [Name of the device: Instron 5581 type manufactured by Instron Co.], pressing the bumps to a 140 µm deep. At the time, a load (a compression load) applied to the silicon wafer chip from the pressure-sensitive adhesive sheet was measured. The measurement was performed at 23° C. under a relative humidity of 50%. The compression stress was calculated from the measured compression load and a surface area of the bumps on whole plane of the pressed chip.

Here, it was supposed that the diameter of the bump was 280 µm and the load was measured when half of the bump was pressed. The surface area (39.9 mm$^2$) of the bumps on whole plane of the chip, when the bumps were pressed to 140 µm, was calculated from a surface area of one bump and a number of bumps (324 bumps); and a compression stress was calculated from the following formula (1).

$$A\ \text{compression stress} = a\ \text{compression load}/a\ \text{surface area of the bumps on whole plane of the chip} \quad (1)$$

(Generation of Dimples or Cracks)

A wafer with solder bumps (a 8-inch silicon wafer wherein chips having a chip size of 10 mm long×10 mm wide are lined, bumps height: 250 µm, bumps pitch: 500 µm and overall thickness: 720 µm) was laminated to the pressure-sensitive adhesive sheet, fixed and grinded as thin as 250 µm or 400 µm (using a grinder DGP8760 manufactured by Disco Co.). And then the back surface of the wafer was visually observed and was confirmed if dimples had generated at places of the back surface of the wafer which correspond to the bumps. No generation of the dimples was determined "A", a slight amount of the dimples were confirmed which cause no problem in practical use was determined "B" and an obvious generation of the dimples was determined "C".

In addition, presence or absence of cracks on the wafer (chipping or breaks of the wafer) was visually observed.

(Difference in Height)

The pressure-sensitive adhesive sheet was laminated to a wafer with bumps having 250 µm height bumps using a laminater "RAD3510" manufactured by Lintec Co. Immediately after, overall thickness "A" (a distance between a back surface of the wafer to a base film surface of the pressure-sensitive adhesive sheet) where bumps exist and overall thickness "B" with no bumps were measured by a constant pressure thickness measuring machine: PG-02 manufactured by Teclock Co., Ltd.; and "A-B (subtracting B from A)" was calculated as the difference in height. The smaller the difference in height, the more moderated the roughness due to heights of the bumps by the pressure-sensitive adhesive sheet.

(Invasion of Grinding Water)

After laminating the pressure-sensitive adhesive sheet to the wafer surface, the back surface of wafer was ground as thin as 250 µm or 400 µm while spraying water, and said pressure-sensitive adhesive sheet was detached from said wafer surface. And presence or absence of invasion of grinding water to the wafer surface was confirmed with an optical digital microscope (a 100-fold magnification).

(Embedability)

The pressure-sensitive adhesive sheet was laminated to the circuit side of the wafer with bumps using a laminater "RAD3510" manufactured by Lintec Co. Immediately after, it was observed by an optical digital microscope (a 300-fold magnification) and an embedded distance between bumps was measured. Here, said embedded distance between bumps is defined as follows.

Straight lines between tops of four adjacent bumps were drawn, assuming a square. A diagonal line of the square was measured and a diameter of the bumps was subtracted from the diagonal line, which was determined a distance between bumps. A distance where the pressure-sensitive adhesive layer and the wafer surface are closely-attached on the diagonal line was measured, and determined the embedded distance between bumps.

(The embedded distance/the distance between bumps)× 100 was calculated, and it was determined an embedability (%). The embedability is an index of an attaching property of the pressure-sensitive adhesive sheet to a gap between bumps. The higher the embedability, the more closely-attached the pressure-sensitive adhesive sheet and the wafer with bumps are, with no presence of gap between the sheet and the wafer. The low embedability defines insufficient attachment of the pressure-sensitive adhesive sheet at a base part of the bumps.

Example 1

To a terminal of an isocyanate-terminated urethane prepolymer obtained by polymerizing polypropylene glycol having a molecular weight of 4,000 calculated from its hydroxyl value (hereinafter referred to as PPG 4000) and isophorone diisocyanate (hereinafter referred to as MDT), 2-hydroxyethyl methacrylate (hereinafter referred to as HEMA) was reacted to give a polyether polyol urethan (meth)acrylate oligomer having a weight average molecular weight of 47,000. Here, the weight-average molecular weight is a value obtained by a commercially available molecular weight measuring machine (Product name "HLC-8220GPC" manufactured by Tosoh Corp.; Column name "TSKGel Super HZM-M" manufactured by Tosoh Corp.; Developing solvent tetrahydrofuran) (the same hereinafter).

The obtained polyether polyol urethan(meth)acrylate oligomer in an amount of 100 g (in terms of solid) was combined with 140 g (in terms of solid) of isobornyl acrylate as an energy ray curable monomer, 160 g (in terms of solid) of 2-hydroxy-3-phenoxypropyl acrylate and 4 g of 2-hydroxy-2-methyl-1-phenyl-propan-1-one (DAROCUR 1173, solid concentration: 100% by mass, manufactured by BASF Co.) as a photoinitiator; and a composition (an energy ray curable composition of a liquid at a normal temperature (viscosity η=3400 mPa·s at 25° C.)) was obtained.

The above composition was applied on a casting process sheet that was a polyethylene terephthalate (PET) removal film (Product name "SP-PET3811" manufactured by Lintec Co., thickness: 38 μm) according to a fountain die technique such that the thickness would be 300 μm, thereby forming a coating; and then UV rays were irradiated from the side of the coating and a semi-cured layer was obtained. The UV irradiation apparatus was a belt conveyer type UV irradiation apparatus (ECS-401GX manufactured by EYE GRAPHICS Co., Ltd.), and the UV source was a high-pressure mercury lamp (H04-L41 manufactured by EYE GRAPHICS Co., Ltd. (conditions: lamp height 150 mm, lamp output 3 kW (reduced output 120 mW/cm), an irradiation at light wavelength of 365 nm 271 mW/cm$^2$, illuminance 177 mJ/cm$^2$ (UV illuminance measurement: UV-351 manufactured by ORC MANUFACTURING CO., LTD.)). Immediately after the irradiation, polyethylene terephthalate (PET) film (T-100 manufactured by Mitsubishi Chemical Polyester Film Corporation, thickness: 75 μm) as a thermoplastic resin layer was laminated on the semi-cured layer, and UV rays were irradiated through the laminated PET film four times to crosslink and cure the energy ray cured layer (irradiation conditions: lamp height 150 mm, lamp output 3 kW (converted output 120 mW/cm), an irradiation at light wavelength of 365 nm 271 mW/cm$^2$, illuminance 1200 mJ/cm$^2$ (UV illuminance measurement: UV-351 manufactured by ORC MANUFACTURING CO., LTD.)). Thereafter, the casting process sheet was removed and a base film having an overall thickness of 375 μm, in which the energy ray cured layer (300 μm) and a thermoplastic resin layer (75 μm) are laminated, was obtained.

Separately from above, 70 parts by weight of butylacrylate and 30 parts by weight of 2-hydroxyethyl acrylate were solution polymerized in ethyl acetate solvent, and an acrylic copolymer having a weight-average molecular weight of 500,000 and a glass-transition temperature of −7° C. was obtained. 100 parts by weight in terms of solid of this acrylic copolymer and 8 parts by weight of (meth) acryloyloxy ethyl isocyanate (80 equivalents with respect to 100 equivalents of hydroxy groups in the acrylic copolymer) were reacted; and an ethyl acetate solution (30% solution) of UV curable acrylic copolymer having a polymerizable double bond in its molecule was obtained.

To 100 parts by weight (in terms of solid) of the UV curable acrylic copolymer, 2.0 parts by weight (in terms of solid) of a polyvalent isocyanate compound (coronate-L manufactured by Nippon Polyurethane Co., Ltd.) as cross-linker and 3.3 parts by weight (in terms of solid) of a photoinitiator (Irgacure 184 manufactured by BASF Co.) were mixed and a UV curable pressure-sensitive adhesive composition was obtained. The UV curable pressure-sensitive adhesive composition was applied and dried on an energy ray cured layer of a base film; and a pressure-sensitive adhesive layer having 50 μm thickness was formed and a pressure-sensitive adhesive sheet was obtained. An evaluation result of the pressure-sensitive adhesive sheet is shown in Tables 1 and 2.

Example 2

A pressure-sensitive adhesive sheet was obtained and evaluated in the same manner as in Example 1, except that the thickness of the energy ray cured layer was 350 μm. The results are shown in Tables 1 and 2.

Example 3

An adhesive sheet was obtained and evaluated in the same manner as in Example 1, except that the thickness of the energy ray cured layer was 400 μm. The results are shown in Tables 1 and 2.

Example 4

A pressure-sensitive adhesive sheet was obtained and evaluated in the same manner as in Example 1, except that the weight-average molecular weight of polyether polyol urethan(meth)acrylate oligomer was 53,000. The results are shown in Tables 1 and 2. Here, a composition (an energy ray curable composition of a liquid at a normal temperature) showed viscosity η=4,800 mPa·s at 25° C.

Example 5

A pressure-sensitive adhesive sheet was obtained and evaluated in the same manner as in Example 1, except that hydrogenated xylylene diisocyanate (hereinafter referred to as HXDI) was used instead of isophorone diisocyanate, and weight-average molecular weight of polyether polyol urethan(meth)acrylate oligomer was 46,000. The results are shown in Tables 1 and 2. Here, a composition (an energy ray curable composition of a liquid at a normal temperature) showed viscosity η=3,400 mPa·s at 25° C.

Example 6

A pressure-sensitive adhesive sheet was obtained and evaluated in the same manner as in Example 1, except that hexamethylene diisocyanate (hereinafter referred to as HDI) was used instead of isophorone diisocyanate, and weight-average molecular weight of polyether polyol urethan(meth) acrylate oligomer was 45,000. The results are shown in Tables 1 and 2. Here, a composition (an energy ray curable composition of a liquid at a normal temperature) showed viscosity η=3,300 mPa·s at 25° C.

Example 7

A pressure-sensitive adhesive sheet was obtained and evaluated in the same manner as in Example 1, except that polypropylene glycol having a molecular weight of 8,000 (hereinafter referred to as PPG 8000) was used instead of PPG 4000, and weight-average molecular weight of the polyether polyol urethan(meth)acrylate oligomer was 68,000. The results are shown in Tables 1 and 2. Here, a composition (an energy ray curable composition of a liquid at a normal temperature) showed viscosity η=3,700 mPa·s at 25° C.

Example 8

A pressure-sensitive adhesive sheet was obtained and evaluated in the same manner as in Example 1, except that poly(oxytetramethylene)glycol having a molecular weight of 3,000 (hereinafter referred to as PTMG 3000) was used instead of PPG 4000, and weight-average molecular weight of the polyether polyol urethan(meth)acrylate oligomer was 45,000. The results are shown in Tables 1 and 2. Here, a composition (an energy ray curable composition of a liquid at a normal temperature) showed viscosity η=4,100 mPa·s at 25° C.

Example 9

A pressure-sensitive adhesive sheet was obtained and evaluated in the same manner as in Example 1, except that polyether polyol urethan(meth)acrylate oligomer having a molecular weight of 40,000 was used instead of the polyether polyol urethan(meth)acrylate oligomer of Example 1. The results are shown in Tables 1 and 2. Here, a composition (an energy ray curable composition of a liquid at a normal temperature) showed viscosity η=2,200 mPa·s at 25° C.

Example 10

A pressure-sensitive adhesive sheet was obtained and evaluated in the same manner as in Example 1, except that polypropylene glycol having a molecular weight of 2,000 (hereinafter referred to as PPG 2000) was used instead of PPG 4000, and weight-average molecular weight of the polyether polyol urethan(meth)acrylate oligomer was 41,000. The results are shown in Tables 1 and 2. Here, a composition (an energy ray curable composition of a liquid at a normal temperature) showed viscosity η=2,300 mPa·s at 25° C.

Example 11

A pressure-sensitive adhesive sheet was obtained and evaluated in the same manner as in Example 1, except that polypropylene glycol having a molecular weight of 10,000 (hereinafter referred to as PPG 10000) was used instead of PPG 4000, and weight-average molecular weight of the polyether polyol urethan(meth)acrylate oligomer was 44,000. The results are shown in Tables 1 and 2. Here, a composition (an energy ray curable composition of a liquid at a normal temperature) showed viscosity η=2,500 mPa·s at 25° C.

Comparative Example 1

A composition was obtained in the same ratio as in Example 1, except that polyester urethan(meth)acrylate oligomer (a weight-average molecular weight of 4000) was used instead of the polyether polyol urethan(meth)acrylate oligomer used in Example 1. A pressure-sensitive adhesive sheet was obtained and evaluated in the same manner as in Example 1, except the obtained composition was used. The results are shown in Tables 1 and 2.

Comparative Example 2

A composition was obtained in the same ratio as in Example 1, except that polycarbonate urethan(meth)acrylate oligomer (a weight-average molecular weight of 6000) was used instead of the polyether polyol urethan(meth)acrylate oligomer used in Example 1. A pressure-sensitive adhesive sheet was obtained and evaluated in the same manner as in Example 1, except the obtained composition was used. The results are shown in Tables 1 and 2.

TABLE 1

|  | Energy ray cured layer | Adhesive sheet | |
| --- | --- | --- | --- |
|  | Modulus of elasticity in torsion [MPa] | Compression load [N] | Compression stress [MPa] |
| Ex. 1 | 0.8 | 6.5 | 0.16 |
| Ex. 2 | 0.8 | 3.2 | 0.08 |
| Ex. 3 | 0.8 | 3.1 | 0.08 |
| Ex. 4 | 1.0 | 5.0 | 0.13 |
| Ex. 5 | 0.7 | 3.3 | 0.08 |
| Ex. 6 | 0.7 | 3.1 | 0.08 |
| Ex. 7 | 0.7 | 3.3 | 0.08 |
| Ex. 8 | 0.9 | 3.8 | 0.10 |
| Ex. 9 | 3.1 | 12.2 | 0.31 |
| Ex. 10 | 4.5 | 19.1 | 0.48 |
| Ex. 11 | 5.2 | 25.3 | 0.63 |
| Comp. Ex. 1 | 6.8 | 58.0 | 1.45 |
| Comp. Ex. 2 | 8.2 | 78 | 1.95 |

TABLE 2

|  | 400 μm grinding | | | 250 μm grinding | | | Difference in height [μm] | Embedability [%] |
| --- | --- | --- | --- | --- | --- | --- | --- | --- |
|  | Dimples | Cracks | Invasion of grinding water | Dimples | Cracks | Invasion of grinding water | | |
| Ex. 1 | A | absence | absence | B | absence | absence | 98 | 70 |
| Ex. 2 | A | absence | absence | A | absence | absence | 68 | 70 |
| Ex. 3 | A | absence | absence | A | absence | absence | 67 | 71 |
| Ex. 4 | A | absence | absence | B | absence | absence | 72 | 68 |
| Ex. 5 | A | absence | absence | A | absence | absence | 66 | 72 |
| Ex. 6 | A | absence | absence | A | absence | absence | 64 | 72 |
| Ex. 7 | A | absence | absence | A | absence | absence | 69 | 72 |
| Ex. 8 | A | absence | absence | B | absence | absence | 71 | 70 |
| Ex. 9 | B | absence | absence | C | presence | presence | 128 | 65 |
| Ex. 10 | B | absence | absence | C | presence | presence | 158 | 58 |
| Ex. 11 | B | absence | absence | C | presence | presence | 171 | 51 |

TABLE 2-continued

|  | 400 μm grinding | | | 250 μm grinding | | | Difference in height [μm] | Embedability [%] |
| --- | --- | --- | --- | --- | --- | --- | --- | --- |
|  | Dimples | Cracks | Invasion of grinding water | Dimples | Cracks | Invasion of grinding water | | |
| Comp. Ex. 1 | C | Existence | presence | C | presence | presence | 238 | 44 |
| Comp. Ex. 2 | C | Existence | presence | C | presence | presence | 273 | 38 |

The invention claimed is:

1. A pressure-sensitive adhesive sheet for laminating onto a semiconductor wafer, comprising:
   a pressure-sensitive adhesive layer (C) on a base film,
   said base film comprising (A) a layer of a cured product in which a composition including a polyether polyol urethane (meth)acrylate oligomer and an energy ray curable monomer is cured by energy ray irradiation, and (B) a thermoplastic resin layer,
   wherein a molecular weight of a polyether polyol moiety of the polyether polyol urethan(meth)acrylate oligomer is 1,000 to 10,000,
   wherein a compression stress at 23° C. of the pressure-sensitive adhesive sheet is 0.05 to 0.3 MPa, and
   wherein said pressure-sensitive adhesive layer (C) is formed on said layer (A), and
   wherein a weight-average molecular weight of the polyether polyol urethane (meth)acrylate oligomer is 40,000 to 100,000.

2. The pressure-sensitive adhesive sheet according to claim 1, wherein the pressure-sensitive adhesive layer (C) is re-releasable to the semiconductor wafer.

3. In combination:
   the pressure-sensitive adhesive sheet according to claim 1, and
   a semiconductor wafer,
   wherein the pressure-sensitive adhesive layer (C) is laminated onto and is re-releasable to the semiconductor wafer.

* * * * *